United States Patent
Grudinin et al.

(10) Patent No.: US 12,326,518 B2
(45) Date of Patent: Jun. 10, 2025

(54) ASYMMETRIC WHISPERING GALLERY MODE RESONATOR

(71) Applicant: GM Cruise Holdings LLC, San Francisco, CA (US)

(72) Inventors: Ivan Grudinin, South Pasadena, CA (US); Vladimir Ilchenko, Arcadia, CA (US); Lutfollah Maleki, Pasadena, CA (US); Sergio Alvarez, Pico Rivera, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 493 days.

(21) Appl. No.: 17/892,383

(22) Filed: Aug. 22, 2022

(65) Prior Publication Data

US 2022/0397646 A1 Dec. 15, 2022

Related U.S. Application Data

(63) Continuation of application No. 16/588,982, filed on Sep. 30, 2019, now Pat. No. 11,454,707.

(51) Int. Cl.
G02F 1/03 (2006.01)
G01S 7/481 (2006.01)
G01S 17/06 (2006.01)

(52) U.S. Cl.
CPC ............ *G01S 7/4814* (2013.01); *G01S 17/06* (2013.01); *G02F 1/0305* (2013.01); *G02F 2201/14* (2013.01)

(58) Field of Classification Search
None
See application file for complete search history.

(56) References Cited

U.S. PATENT DOCUMENTS

| 7,440,651 B1 | 10/2008 | Savchenkov et al. |
| 8,102,597 B1 | 1/2012 | Maleki et al. |

(Continued)

FOREIGN PATENT DOCUMENTS

| CN | 104868352 A | 8/2015 |
| CN | 107567592 A | 1/2018 |

(Continued)

OTHER PUBLICATIONS

'Notification of Acceptance of Request for Reexamination for Chinese Patent Application No. 201980100988.X', Mailed Date: Aug. 18, 2023, 2 pages.

(Continued)

*Primary Examiner* — Hovhannes Baghdasaryan
(74) *Attorney, Agent, or Firm* — CANTOR COLBURN LLP

(57) ABSTRACT

An asymmetric whispering gallery mode resonator device is described. The resonator device includes an asymmetric whispering gallery mode resonator disk (e.g., transparent material, electrooptic material). The resonator disk includes an axial surface along a perimeter of the resonator disk, a top surface, and a bottom surface. A first midplane passes through the axial surface dividing the axial surface into symmetrical halves. The top surface and the bottom surface are substantially parallel, and a second midplane is substantially equidistant between the top surface and the bottom surface. The first midplane and the second midplane are non-coextensive. The asymmetric whispering gallery mode resonator disk can further include a first chamfered edge between the top surface and the axial surface, and a second chamfered edge between the bottom surface and the axial surface. Moreover, the resonator device includes a first electrode on the top surface and a second electrode on the bottom surface.

20 Claims, 7 Drawing Sheets

(56) References Cited

U.S. PATENT DOCUMENTS

| | | |
|---|---|---|
| 11,454,707 B2 | 9/2022 | Grudinin et al. |
| 2019/0094366 A1 | 3/2019 | Maleki et al. |
| 2021/0096222 A1 | 4/2021 | Grudinin et al. |

FOREIGN PATENT DOCUMENTS

| | | |
|---|---|---|
| CN | 114761826 A | 7/2022 |
| EP | 4004589 A1 | 6/2022 |
| WO | 2021066865 A1 | 4/2021 |

OTHER PUBLICATIONS

"Request for Reexamination for Chinese Patent Application No. 201980100988X", Filed Date: Aug. 14, 2023, 18 pages.

"Office Action for Chinese Patent Application No. 201980100988. X", Mailed Date: Apr. 29, 2023, 6 pages.

"International Preliminary Report on Patentability for PCT Patent Application No. PCT/US2019/068763", Mailed Date: Apr. 5, 2022, 7 pages.

"International Search Report for PCT Patent Application No. PCT/US2019/068763", Mailed Date: Jun. 12, 2020, 4 pages.

"Notice of Allowance and Fees Due for U.S. Appl. No. 16/588,982", Mailed Date: May 20, 2022, 7 pages.

"Office Action for European Patent Application No. 19842558.9", Mailed Date: Mar. 10, 2022, 3 pages.

"Tailored Asymmetry for Enhanced Coupling to WGM Resonators", NASA's Jet Propulsion Labaratory, NASA Tech Briefs, Mar. 2008, p. 10.

"Written Opinion for PCT Patent Application No. PCT/US2019/068763", Mailed Date: Jun. 12, 2020, 6 pages.

"PPH Request for Chinese Patent Application No. 201980100988X", Filed Date: Aug. 18, 2022, 3 pages.

"Request for Examination for Chinese Patent Application No. 201980100988X", Filed Date: Aug. 18, 2022, 2 pages.

"Notice of Approval of Request for PPH for Chinese Patent Application No. 201980100988.X" Mailed Date: Nov. 3, 2022, 1 page.

'Notification of Entry into the Examination Procedure for Chinese Patent Application No. 201980100988.X', Mailed Date: Aug. 24, 2022, 2 pages.

"Office Action for Chinese Patent Application No. 201980100988X", Mailed Date: Nov. 29, 2022, 8 pages.

"Response to the Office Action for European Patent Application No. 19842558.9", Filed Date: Aug. 30, 2022, 26 pages.

"Response to the Office Action for Chinese Patent Application No. 201980100988X", Filed Date: Apr. 18, 2023, 5 pages.

ASYMMETRIC WHISPERING GALLERY MODE RESONATOR

CROSS-REFERENCE TO RELATED APPLICATION

This application is a continuation of U.S. patent application Ser. No. 16/588,982, filed on Sep. 30, 2019, and entitled "ASYMMETRIC WHISPERING GALLERY MODE RESONATOR", the entirety of which is incorporated herein by reference.

BACKGROUND

Light detection and ranging (lidar) systems are surveying systems that measure distance to a target in an environment by illuminating the target with laser light and measuring reflected light (lidar return). Properties of the lidar return can be measured to generate a three-dimensional (3D) representation of the target. Lidar systems can also be used to measure the velocity of the target with respect to the observer. Thus, lidar systems can be used in various terrestrial, airborne, and mobile applications; for instance, lidar systems can be employed in autonomous or semi-autonomous vehicles, drones, robotics, and other applications that utilize laser scanning capabilities.

Lidar systems emit one or more beams of light and identify distances to and speeds of various objects in the operational environment of the lidar system based upon reflections of the beams from the objects. Lidar systems incorporate various optical and electrical elements that facilitate emission and reception of light. By way of example, a lidar system can include a laser and a high quality factor (Q) whispering gallery mode resonator along with various other componentry to control emission and reception of the light. The laser and the resonator are optically coupled, such that light from the laser is provided to the resonator, circulates inside the resonator undergoing total internal reflection, and is provided back from the resonator to the laser.

An example of a type of high Q whispering gallery mode resonator that is often used in lidar systems is a disk resonator. Conventional designs of disk resonators can intrinsically support a plurality of modes per each free spectral range (FSR). Mode positions in the traditional disk resonators can be determined by resonator geometry, which can have variations due to limited fabrication precision. Accordingly, many fabricated disk resonators can have side modes near a working mode (e.g., within a certain frequency range), which can render such resonators unusable. Thus, resonator production yield for conventional disk-shaped resonators used for lidar systems can be detrimentally impacted.

SUMMARY

The following is a brief summary of subject matter that is described in greater detail herein. This summary is not intended to be limiting as to the scope of the claims.

Described herein are various technologies that pertain to asymmetric high Q whispering gallery mode resonators. An asymmetric whispering gallery mode resonator device can include an asymmetric whispering gallery mode resonator disk formed of a transparent material. For instance, the transparent material can be an electrooptic material. The asymmetric whispering gallery mode resonator disk can include an axial surface along a perimeter of the asymmetric whispering gallery mode resonator disk. A first midplane passes through the axial surface dividing the axial surface into symmetrical halves. The asymmetric whispering gallery mode resonator disk can further include a top surface and a bottom surface, where the bottom surface is substantially parallel to the top surface. A second midplane can be substantially equidistant between the top surface and the bottom surface. The first midplane and the second midplane are non-coextensive. The asymmetric whispering gallery mode resonator disk can further include a first chamfered edge between the top surface and the axial surface, and a second chamfered edge between the bottom surface and the axial surface. The axial surface, the first chamfered edge, and the second chamfered edge can form a convex side structure of the asymmetric whispering gallery mode resonator disk. Moreover, the asymmetric whispering gallery mode resonator device can include a first electrode on the top surface of the asymmetric whispering gallery mode resonator disk and a second electrode on the bottom surface of the asymmetric whispering gallery mode resonator disk.

The asymmetric whispering gallery mode resonator device can support a fundamental mode located in the first midplane. Due to the first midplane and the second midplane being non-coextensive, the plane in which the fundamental mode is located is non-coextensive with the second midplane (e.g., the fundamental mode is not in a midplane substantially equidistant between the top surface and the bottom surface of the asymmetric whispering gallery mode resonator disk). For example, the first midplane can be shifted relative to the second midplane. According to another example, the first midplane can be tilted relative to the second midplane. The positioning of the fundamental mode in the asymmetric whispering gallery mode resonator disk as described herein can enable suppression of side mode(s) in the asymmetric whispering gallery mode resonator device.

Pursuant to various embodiments, the first midplane in which the fundamental mode is located can be shifted relative to the second midplane, which is substantially equidistant between the top surface and the bottom surface. In such embodiments, the first midplane that passes through the axial surface dividing the axial surface into symmetrical halves can be shifted towards either the top surface or the bottom surface relative to the second midplane. Thus, a first distance between the first midplane and the top surface can differ from a second distance between the first midplane and the bottom surface. Accordingly, a position of the fundamental mode located in the first midplane in such embodiments can be shifted towards either the top surface or the bottom surface as opposed to being located in the second midplane equidistant between the top surface and the bottom surface of resonator disk. The shifting of the position of the fundamental mode can cause side mode(s) nearby the fundamental mode to suffer losses due to being positioned closer to an electrode of the asymmetric whispering gallery mode resonator device (e.g., the side mode(s) can experience losses due to interaction with metal of the electrode).

In accordance with other embodiments, the first midplane in which the fundamental mode is located can be tilted relative to the second midplane. Accordingly, the first midplane that passes through the axial surface of the asymmetric whispering gallery mode resonator disk dividing the axial surface into symmetrical halves and the second midplane that is substantially equidistant between the top surface and the bottom surface can be tilted relative to each other. The first midplane and the second midplane can intersect within the asymmetric whispering gallery mode resonator disk. The tilting of the position of the first midplane in which the fundamental mode is located can cause side mode(s) nearby the fundamental mode to suffer losses due to being positioned closer to an electrode of the asymmetric whispering gallery mode resonator device.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
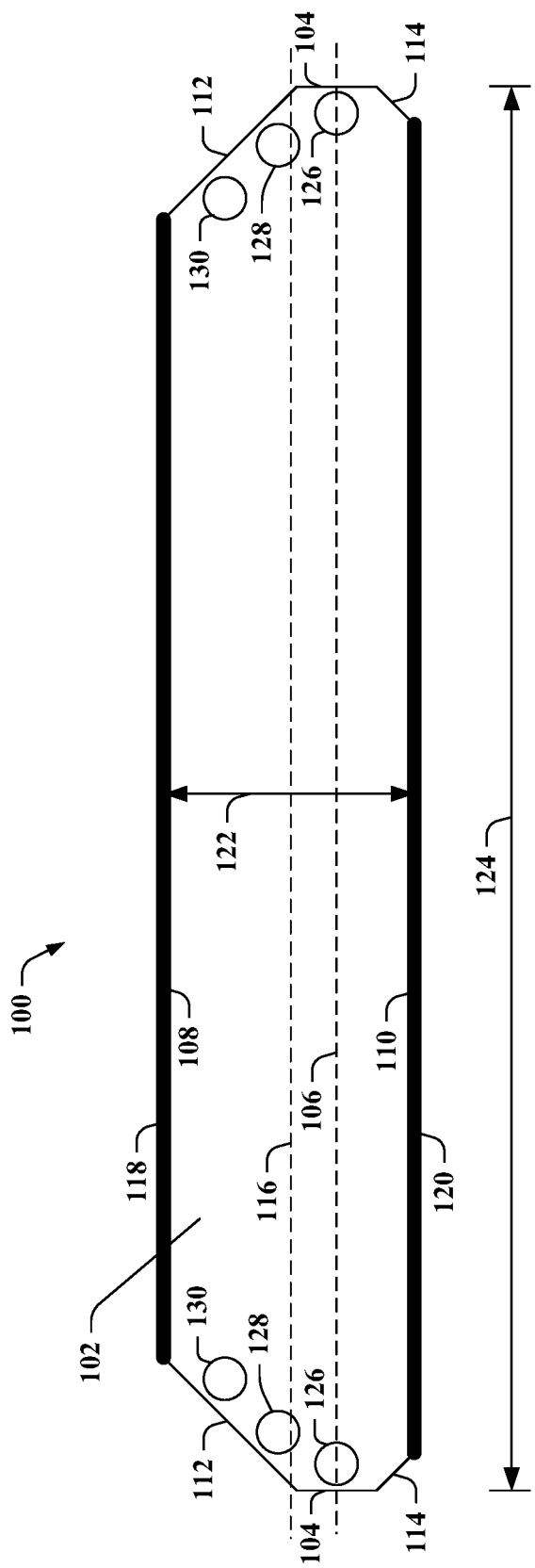
FIG. 1 illustrates a cross-sectional view of an exemplary asymmetric whispering gallery mode resonator device.

Various technologies pertaining to asymmetric whispering gallery mode resonators are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the terms "component" and "system" are intended to encompass computer-readable data storage that is configured with computer-executable instructions that cause certain functionality to be performed when executed by a processor. The computer-executable instructions may include a routine, a function, or the like. The terms "component" and "system" are also intended to encompass one or more optical elements that can be configured or coupled together to perform various functionality with respect to an optical signal. It is also to be understood that a component or system may be localized on a single device or distributed across several devices. Further, as used herein, the term "exemplary" is intended to mean "serving as an illustration or example of something."

Referring now to the drawings, FIG. 1 illustrates a cross-sectional view of an exemplary asymmetric whispering gallery mode resonator device 100 (also referred to herein as a resonator device 100). As used herein, the terms "resonator device" and "resonator" are used interchangeably. The resonator device 100 includes an asymmetric whispering gallery mode resonator disk 102 (also referred to herein as a resonator disk 102) formed of a transparent material. According to various embodiments, the transparent material can be an electrooptic material. For example, the asymmetric whispering gallery mode resonator disk 102 can be formed of any of various crystalline materials such as calcium fluoride, magnesium fluoride, lithium niobate, lithium tantalate, silicon, or the like. However, it is contemplated that the resonator disk 102 can be formed of a transparent material other than an electrooptic material.

The asymmetric whispering gallery mode resonator disk 102 includes an axial surface 104 along a perimeter of the asymmetric whispering gallery mode resonator disk 102. A first midplane 106 passes through the axial surface 104 dividing the axial surface 104 into symmetrical halves. Thus, as shown, a top half of the axial surface 104 is above the first midplane 106 and a bottom half of the axial surface 104 is below the first midplane 106.

The asymmetric whispering gallery mode resonator disk 102 further includes a top surface 108, a bottom surface 110, a first chamfered edge 112, and a second chamfered edge 114. The bottom surface 110 is substantially parallel to the top surface 108. A second midplane 116 is substantially equidistant between the top surface 108 and the bottom surface 110. The second midplane 116 and the first midplane 106 are non-coextensive. Moreover, the first chamfered edge 112 is between the top surface 108 and the axial surface 104, and the second chamfered edge 114 is between the bottom surface 110 and the axial surface 104. Further, the axial surface 104, the first chamfered edge 112, and the second chamfered edge 114 form a convex side structure of the asymmetric whispering gallery mode resonator disk 102 (e.g., the axial surface 104, the first chamfered edge 112, and the second chamfered edge have a convex geometry from a point of view external to the resonator device 100). The convex side structure of the asymmetric whispering gallery mode resonator disk 102 can simplify fabrication, polishing, cleaning, etc. of the resonator device 100.

The resonator device 100 can further include chamfered edges 112-114 with differing widths. In particular, a width of the first chamfered edge 112 can differ from a width of the second chamfered edge 114. In the example shown in FIG. 1, the width of the first chamfered edge 112 can be greater than the width of the second chamfered edge 114.

The resonator device 100 further includes a first electrode 118 on the top surface 108 of the asymmetric whispering gallery mode resonator disk 102 and a second electrode 120 on the bottom surface 110 of the asymmetric whispering gallery mode resonator disk 102. Substantially any type of electrodes 118-120 can be on the top and bottom surfaces 108-110 of the asymmetric whispering gallery mode resonator disk 102. According to an illustration, an optical insulator can be adjacent to the material of the asymmetric whispering gallery mode resonator disk 102. Further, a layer of a bonding metal, such as chromium or titanium, can be on the optical insulator, and the electrode can be on the bonding metal. Following this illustration, an optical insulator layer and a bonding metal layer can be between the top surface 108 and the first electrode 118. Likewise, an optical insulator layer and a bonding metal layer can be between the bottom surface 110 and the second electrode 120. However, it is to be appreciated that the claimed subject matter is not limited to the foregoing illustration. Moreover, according to an example, the electrodes 118-120 can be formed of gold; yet, it is contemplated that the electrodes 118-120 can be formed of other materials.

According to various embodiments, a thickness 122 of the asymmetric whispering gallery mode resonator disk 102 can be in a range between 40 and 60 micrometers. As described herein, ranges can be inclusive ranges; thus, 40 and 60 micrometers are intended to fall within the scope of the aforementioned range. According to an example, the thickness 122 of the asymmetric whispering gallery mode resonator disk 102 can be 45 micrometers, 50 micrometers, or the like. Further, a diameter 124 of the asymmetric whispering gallery mode resonator disk 102 can be in a range between 1.2 and 1.4 millimeters. Pursuant to an example, the diameter 124 of the asymmetric whispering gallery mode resonator disk 102 can be 1.3 millimeters. However, it is to be appreciated that differing thicknesses 122 and diameters 124 are intended to fall within the scope of the hereto appended claims since the approaches described herein can be scaled (e.g., the thickness 122 need not be in the range between 40 and 60 micrometers, the diameter 124 need not be in the range between 1.2 and 1.4 millimeters).

As noted above, the second midplane 116 is substantially equidistant between the top surface 108 and the bottom surface 110. A distance between the top surface 108 and the second midplane 116 can be substantially equal to a distance between the bottom surface 110 and the second midplane 116. Thus, the distance between the top surface 108 and the second midplane 116 can be half the thickness 122 of the asymmetric whispering gallery mode resonator disk 102, and the distance between the bottom surface 110 and the second midplane 116 can be half the thickness 122 of the asymmetric whispering gallery mode resonator disk 102.

An optical whispering gallery mode resonator device can have a set of optical mode families that it supports. Frequencies of modes in each family can be determined by material properties. Further, the set of mode families can be determined by a shape of the whispering gallery mode resonator device. The asymmetric whispering gallery mode resonator device 100 can support a fundamental mode 126 located in the first midplane 106. A fundamental mode can also be referred to as a lidar working mode. The fundamental mode 126 in the first midplane 106 is located at an outer extremity towards the perimeter of the asymmetric whispering gallery mode resonator disk 102 (e.g., towards the axial surface 104 in the first midplane 106).

Moreover, side modes (also referred to as higher order modes) can be located progressively away from a location of a fundamental mode in a whispering gallery mode resonator device. Side modes can exist in vicinity of the fundamental mode, resulting in dense resonator spectrum. The side modes can include transverse and radial modes. Transverse modes can extend in an axial (e.g., up and down) direction from the location of the fundamental mode, and radial modes can extend in the radial direction from the location of the fundamental mode towards the center of a resonator device. A side mode 128 and a side mode 130 are depicted in FIG. 1 for purposes of illustration. It is contemplated that the claimed subject matter is not limited to the resonator device 100 including two side modes.

Due to the first midplane 106 and the second midplane 116 being non-coextensive, a plane in which the fundamental mode 126 is located is non-extensive with the second midplane 116. Accordingly, the fundamental mode 126 is not positioned in the second midplane 116 substantially equidistant between the top surface 108 and the bottom surface 110. In the embodiment of the resonator device 100 depicted in FIG. 1, the asymmetric whispering gallery mode resonator disk 102 can have the first midplane 106 shifted related to the second midplane 116. Thus, a position of the fundamental mode 126 located in the first midplane 106 can be shifted towards either the top surface 108 or the bottom surface 110 as opposed to being located in the second midplane 116 equidistant between the top surface 108 and the bottom surface 110 of the resonator disk 102. In particular, FIG. 1 shows the first midplane 106 being shifted towards the bottom surface 110 relative to the second midplane 116. Accordingly, a first distance between the first midplane 106 and the top surface 108 can differ from a second distance between the first midplane 106 and the bottom surface 110 (e.g., the distance between the first midplane 106 and the bottom surface 110 is less than the distance between the first midplane 106 and the top surface 108 in the example depicted in FIG. 1).

Figure 3:
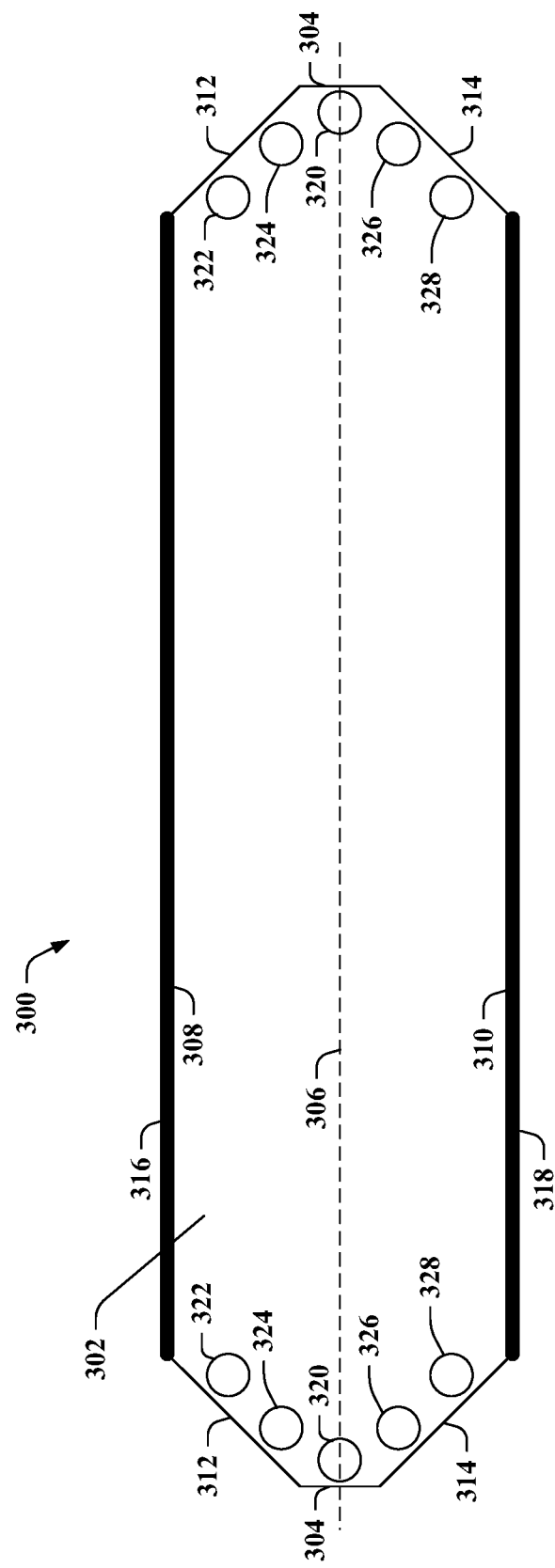
FIG. 3 illustrates a cross-sectional view of an exemplary symmetric whispering gallery mode resonator device.

Shifting of the position of the fundamental mode 126 can cause side mode(s) nearby the fundamental mode 126 to suffer losses due to be positioned closer to an electrode of the asymmetric whispering gallery mode resonator device 100. As depicted in FIG. 1, the number of side modes with a large axial extent (e.g., along a disk axis, up and down) can be lowered (compared to a symmetric whispering gallery mode resonator device as shown in FIG. 3) by reducing the amount of space in which such side modes can exist. The foregoing can be achieved in the resonator device 100 by placing the fundamental mode plane (e.g., the first midplane 106) closer to the bottom surface 110 and the second electrode 120. Thus, side mode(s) (e.g., transverse mode(s)) with high axial extent) between the first midplane 106 and the bottom surface 110 can experience losses due to interaction with metal of the second electrode 120, while the fundamental mode 126 can remain relatively unaffected.

Figure 2:
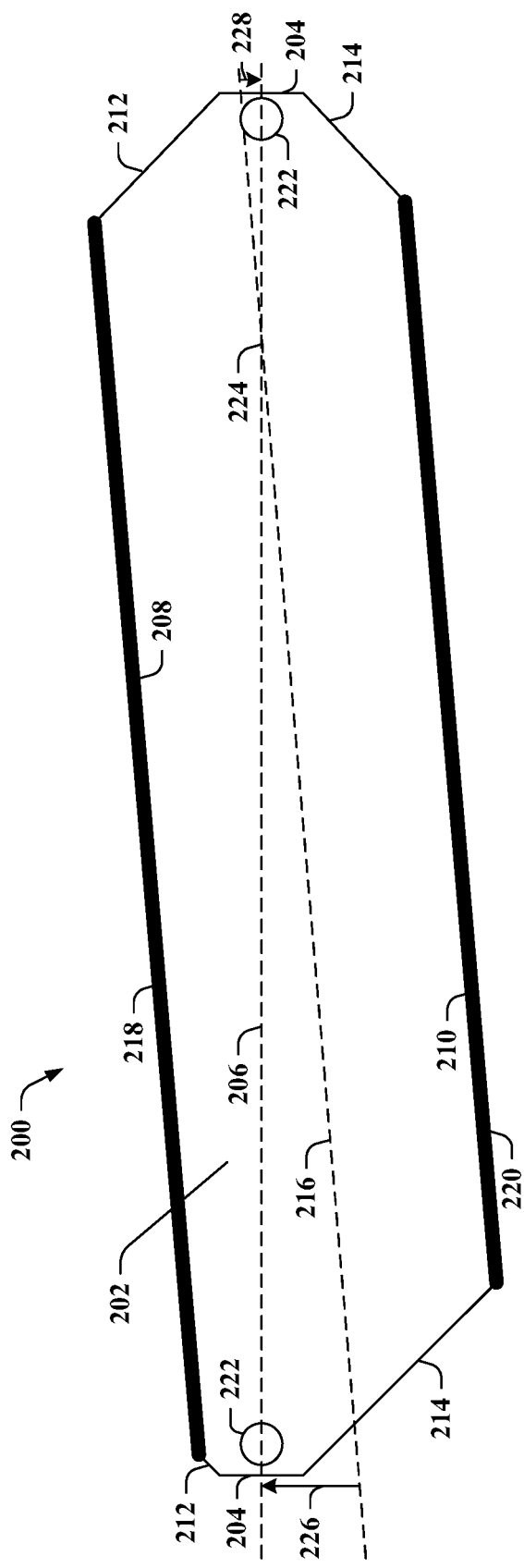
FIG. 2 illustrates a cross-sectional view of another exemplary asymmetric whispering gallery mode resonator device.

Now turning to FIG. 2, illustrated is a cross-sectional view of another exemplary asymmetric whispering gallery mode resonator device 200 (resonator device 200). Similar to the resonator device 100 of FIG. 1, the resonator device 200 includes an asymmetric whispering gallery mode resonator disk 202 (resonator disk 202) formed of a transparent material (e.g., an electrooptic material). Similar to the resonator disk 102 of FIG. 1, the asymmetric whispering gallery mode resonator disk 202 includes an axial surface 204 along a perimeter, where a first midplane 206 passes through the axial surface 204 dividing the axial surface 204 into symmetrical halves.

Similar to the resonator disk 102 of FIG. 1, the asymmetric whispering gallery mode resonator disk 202 also includes a top surface 208, a bottom surface 210, a first chamfered edge 212, and a second chamfered edge 214. The bottom surface 210 and the top surface 208 are substantially parallel to each other, and a second midplane 216 is substantially equidistant between the top surface 208 and the bottom surface 210. Moreover, the first midplane 206 and the second midplane 216 are non-coextensive. Further, the first chamfered edge 212 is between the top surface 208 and the axial surface 204, and the second chamfered edge 214 is between the bottom surface 210 in the axial surface 204. The first chamfered edge 212, the axial surface 204, and the second chamfered edge 214 form a convex side structure of the asymmetric whispering gallery mode resonator disk 202. In the example shown in FIG. 2, widths of the first chamfered edge 212 and the second chamfered edge 214 can be substantially similar.

The asymmetric whispering gallery mode resonator device 200 also includes a first electrode 218 and a second electrode 220. The first electrode 218 is on the top surface 208 of the asymmetric whispering gallery mode resonator disk 202. Moreover, the second electrode 220 is on the bottom surface 210 of the asymmetric whispering gallery mode resonator disk 202.

Again, it is contemplated that a thickness of the asymmetric whispering gallery mode resonator disk 202 can be in a range between 40 and 60 micrometers (e.g., 45 micrometers, 50 micrometers). Moreover, it is contemplated that a diameter of the asymmetric whispering gallery mode resonator disk 202 can be in a range between 1.2 and 1.4 millimeters (e.g., 1.3 millimeters). Yet, the claimed subject matter is not limited to the foregoing examples since the approaches described herein can be scaled (e.g., the thickness need not be in the range between 40 and 60 micrometers, the diameter need not be in the range between 1.2 and 1.4 millimeters).

The asymmetric whispering gallery mode resonator device 200 can support a fundamental mode 222 located in the first midplane 206. Further, although not shown, side mode(s) can be located progressively away from a location of the fundamental mode 222 in the resonator device 200.

Due to the first midplane 206 and the second midplane 216 being non-coextensive, a plane in which the fundamental mode 222 is located is non-extensive with the second midplane 216. Accordingly, the fundamental mode 222 is not positioned in the second midplane 216 substantially equidistant between the top surface 208 and the bottom surface 210. In the embodiment of the resonator device 200 shown in FIG. 2, the first midplane 206 and the second midplane 216 of the asymmetric whispering gallery mode resonator disk 202 can be tilted relative to each other. The first midplane 206 and the second midplane 216 intersect within the asymmetric whispering gallery mode resonator disk 202 (at intersection 224). Tilting of the fundamental mode plane (e.g., the first midplane 206) can be obtained by mounting a substrate from which the resonator device 200 is formed at an angle before resonator fabrication.

The tilting of the position of the first midplane 206 in which the fundamental mode 222 is located can cause side mode(s) nearby the fundamental mode 222 to suffer losses due to being positioned closer to an electrode of the asymmetric whispering gallery mode resonator device 200. Similar to the resonator device 100 of FIG. 1, the resonator device 200 of FIG. 2 can reduce the number of side modes with large axial extent (e.g., along the disk axis, up and down) as compared to a symmetrical whispering gallery mode resonator device (e.g., as shown in FIG. 3) by reducing the amount of space in which such side modes can exist. More particularly, an angle between the fundamental mode axis (e.g., the first midplane 206) and the resonator disk axis (e.g., the second midplane 216) can be introduced. The angle between the first midplane 206 and the second midplane 216 can cause the fundamental mode plane (e.g., the first midplane 206 in which the fundamental mode 222 is located) to wobble up and down in the resonator device 200 and approach closer to edges of the resonator device 200. Thus, side mode(s) (e.g., transverse mode(s) with high axial extent) can experience losses due to interaction with metal of the electrodes 218-220, while the fundamental mode 222 can remain relatively unaffected.

In the example shown in FIG. 2, an offset A 226 can be greater than an offset B 228. The offset A 226 is between the first midplane 206 and the second midplane 216 on one side of the asymmetric whispering gallery mode resonator disk 202, and the offset B 228 is between the first midplane 206 and the second midplane 216 on the opposite side of the whispering gallery mode resonator disk 202. The wobble can be set forth as follows: Wobble=|Offset A|+|Offset B|. It is also contemplated that, according to various embodiments, the offset A can equal the offset B; thus, in such embodiments, the asymmetric whispering gallery mode resonator disk can have a symmetric tilt.

Pursuant to various examples, a minimum mode distance from a surface can be 7.5 pm 2.5 μm. Moreover, an angle can be 1.6 pm 0.2 degrees; yet, the claimed subject matter is not limited to the foregoing examples.

Referring to FIG. 3, illustrated is a cross-sectional view of an exemplary symmetric whispering gallery mode resonator device 300 (resonator device 300). The resonator device 300 includes a symmetric whispering gallery mode resonator disk 302 (resonator disk 302) formed of a transparent material (e.g., an electrooptic material). The symmetric whispering gallery mode resonator disk 202 includes an axial surface 304 along a perimeter, where a midplane 306 passes through the axial surface 304 dividing the axial surface 304 into symmetrical halves.

The symmetrical whispering gallery mode resonator disk 302 also includes a top surface 308, a bottom surface 310, a first chamfered edge 312, and a second chamfered edge 314. In the example of FIG. 3, the midplane 306 is also substantially equidistant between the top surface 308 and the bottom surface 310. The symmetric whispering gallery mode resonator device 300 also includes a first electrode 316 on the top surface 308 and a second electrode 318 on the bottom surface 310.

The symmetric whispering gallery mode resonator device 300 supports a fundamental mode 320 in the midplane 306 of the resonator device 300. Moreover, side modes can be located progressively away from the fundamental mode in the midplane of 302. Moreover, side modes (e.g., a side mode 322, a side mode 324, a side mode 326, and a side mode 328) can be located in vicinity of the fundamental mode 320. Four side modes 322-328 are depicted for purposes of illustration. As described above, the asymmetric whispering gallery mode resonator device 100 of FIG. 1 and the asymmetric whispering gallery mode resonator device 200 of FIG. 2 can reduce the number of side modes relative to the symmetric whispering gallery mode resonator device 300 shown in FIG. 3 (e.g., by having the fundamental mode plane differ from the midplane of the resonator device).

Figure 5:
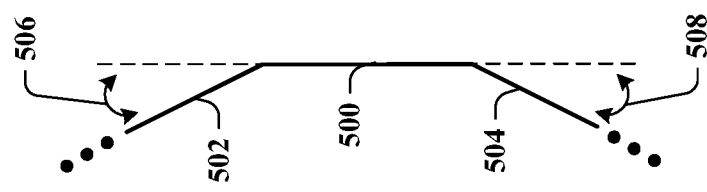
FIGS. 4-5 illustrate cross-sectional views of portions of exemplary convex side structures of a whispering gallery mode resonator disk.
Figure 4:
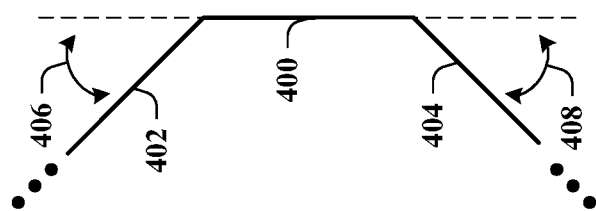

Now turning to FIGS. 4-5, illustrated are cross-sectional views of portions of exemplary convex side structures of a whispering gallery mode resonator disk (e.g., the asymmetric whispering gallery mode resonator disk 102 of FIG. 1, the asymmetric whispering gallery mode resonator disk 202 of FIG. 2, the symmetric whispering gallery mode resonator disk 302 of FIG. 3). The convex side structures include an axial surface (e.g., the axial surface 104, the axial surface 204, the axial surface 304), a first chamfered edge (e.g., the first chamfered edge 112, the first chamfered edge 212, the first chamfered edge 312), and a second chamfered edge (e.g., the second chamfered edge 114, the second chamfered edge 214, the second chamfered edge 314). An angle of the first chamfered edge relative to the axial surface can be in a range between 20 and 45 degrees. Moreover, an angle of the second chamfered edge relative to the axial surface can be in a range between 20 and 45 degrees.

With reference to FIG. 4, depicted are an axial surface 400, a first chamfered edge 402, and a second chamfered edge 404 of a convex side structure of a whispering gallery mode resonator disk. An angle 406 of the first chamfered edge 402 relative to the axial surface 400 can be approximately 45 degrees. Similarly, an angle 408 of the second chamfered edge 404 relative to the axial surface 400 can be approximately 45 degrees.

Now turning to FIG. 5, illustrated are an axial surface 500, a first chamfered edge 502, and a second chamfered edge 504 of another convex side structure of a whispering gallery mode resonator disk. An angle 506 of the first chamfered edge 502 relative to the axial surface 450 can be approximately 20 degrees. Similarly, an angle 508 of the second chamfered edge 504 relative to the axial surface 500 can be approximately 20 degrees.

The convex side structure shown in FIG. 4 (e.g., the angle 406 and the angle 408 each being approximately 45 degrees) can reduce coupling of side modes to a prism coupler as compared to the convex side structure shown in FIG. 5 (e.g., the angle 506 and the angle 508 each being approximately 20 degrees). However, electrical tuneability of the convex side structure shown in FIG. 4 can be reduced as compared to the convex side structure shown in FIG. 5 since metal of the electrodes is moved farther away from the axial surface 400 in the convex side structure of FIG. 4.

The convex nature of the side structures (e.g., the axial surface, the first chamfered edge, and the second chamfered edge) in the examples set forth herein can be easier to make, polish, and clean as compared to whispering gallery mode resonator disks that include concave side structures. Moreover, while shown as having substantially similar angles between the first chamfered edge relative to the axial surface and the second chamfered edge relative to the axial surface in FIGS. 4-5, it is to be appreciated that such angles can differ (e.g., the angle 406 of the first chamfered edge 402 relative to the axial surface 400 can differ from the angle 408 of the second chamfered edge 404 relative to the axial surface 400, the angle 506 of the first chamfered edge 502 relative to the axial surface 500 can differ from the angle 508 of the second chamfered edge 504 relative to the axial surface 500).

Figure 7:
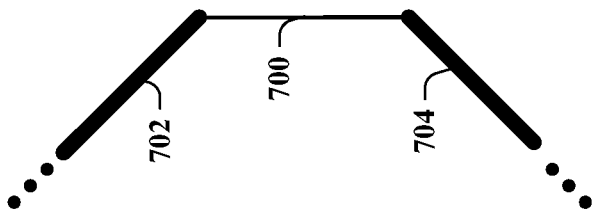
FIGS. 6-7 illustrate cross-sectional views of portions of other exemplary convex side structures of a whispering gallery mode resonator disk.
Figure 6:
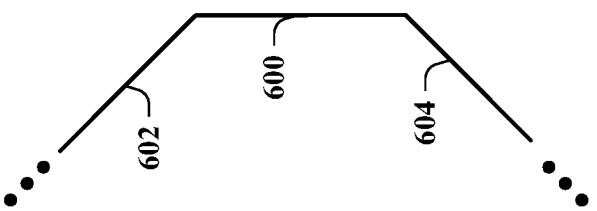

FIGS. 6-7 depict cross-sectional views of portions of other exemplary convex side structures of a whispering gallery mode resonator disk (e.g., the asymmetric whispering gallery mode resonator disk 102 of FIG. 1, the asymmetric whispering gallery mode resonator disk 202 of FIG. 2, the symmetric whispering gallery mode resonator disk 302 of FIG. 3). The convex side structures include an axial surface (e.g., the axial surface 104, the axial surface 204, the axial surface 304, the axial surface 400, the axial surface 500), a first chamfered edge (e.g., the first chamfered edge 112, the first chamfered edge 212, the first chamfered edge 312, the first chamfered edge 402, the first chamfered edge 502), and a second chamfered edge (e.g., the second chamfered edge 114, the second chamfered edge 214, the second chamfered edge 314, the second chamfered edge 404, the second chamfered edge 504).

Now referring to FIG. 6, illustrated are an axial surface 600, a first chamfered edge 602, and a second chamfered edge 604. As shown in FIG. 6, the axial surface 600, the first chamfered edge 602, and the second chamfered edge 604 are polished. FIG. 7 depicts another example of an axial surface 700, a first chamfered edge 702, and the second chamfered edge 704. In the example of FIG. 7, the axial surface 700 is polished, whereas the first chamfered edge 702 and the second chamfered edge 704 are unpolished. Side mode(s) can be suppressed in the example set forth in FIG. 7, where the first chamfered edge 702 and the second chamfered edge 704 are unpolished. More particularly, the unpolished chamfered edges can scatter light, which causes side mode(s) to be suppressed. However, the claimed subject matter is not so limited.

Figure 8:
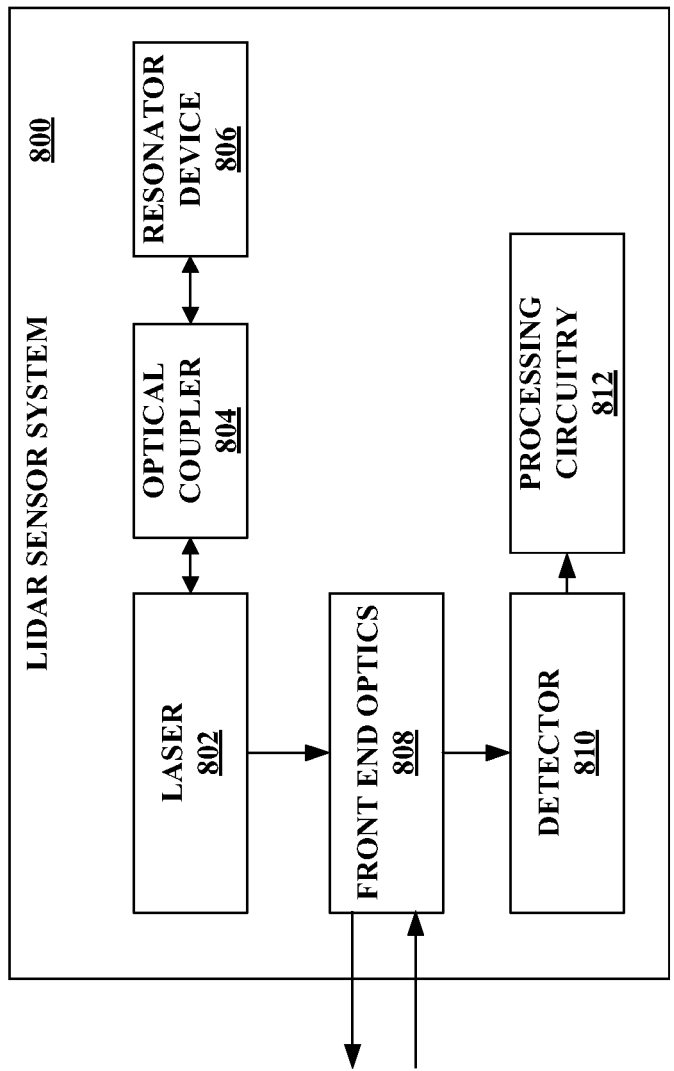
FIG. 8 illustrates a block diagram of an exemplary lidar sensor system.

With reference to FIG. 8, illustrated is an exemplary lidar sensor system 800. The lidar sensor system 800 can be a frequency modulated continuous wave (FMCW) lidar sensor system; however, the claimed subject matter is not so limited. The lidar sensor system 800 includes a laser 802, an optical coupler 804, and a resonator device 806. The optical coupler 804 is coupled to the laser 802, and the resonator device 806 is coupled to the optical coupler 804. The resonator device 806 can be the asymmetric whispering gallery mode resonator device 100 of FIG. 1, the asymmetric whispering gallery mode resonator device 200 of FIG. 2, the symmetric whispering gallery mode resonator device 300 of FIG. 3, or the like.

The laser 802 can be a semiconductor laser, a laser diode, or the like. The optical coupler 804 can be configured to couple light outputted by the laser 802 to the resonator device 806. Further, the optical coupler 804 can be configured to couple light returning from the resonator device 806 to the laser 802.

As described herein, the resonator device 806 can include electrodes to which a voltage can be applied. Application of a voltage to the resonator device 806 can change an optical property of an electrooptic material of the resonator device 806. For instance, application of a voltage can change an index of refraction of the electrooptic material of the resonator device 806.

The laser 802 is optically injection locked to the resonator device 806. The laser 802 can be injection locked to a fundamental mode of the resonator device 806. Further, side mode(s) can be suppressed as described herein. Moreover, since the laser 802 is optically injection locked to the resonator device 806, a voltage applied to the resonator device 806 can impart a frequency change on the laser 802.

The lidar sensor system 800 further includes front end optics 808 configured to transmit, into an environment of the lidar sensor system 800, at least a portion of an optical signal generated by the laser 802. According to various examples, the front end optics 808 can include a scanner, which can direct the optical signal over a field of view in the environment. The front end optics 808 can also include other optical elements, such as one or more lenses, an optical isolator, one or more waveguides, an optical amplifier, an interferometer, and so forth. Such optical elements can enable generating the optical signal with desired properties such as collimation, divergence angle, linewidth, power, and the like. Such optical elements may be assembled discretely, or integrated on a chip, or in a combination of both. The front end optics 808 can also be configured to receive a reflected optical signal from the environment. The reflected optical signal can correspond to at least a part of the optical signal transmitted into the environment that reflected off an object in the environment.

Moreover, the lidar sensor system 800 can include a detector 810 (e.g., a photodetector) and processing circuitry 812. The detector 810 can be configured to mix the reflected optical signal received by the front end optics 808 with a local oscillator portion of the optical signal generated by the laser 802. The processing circuitry 812 can be configured to compute distance and velocity data of the object in the environment based on output of the detector 810.

Figure 9:
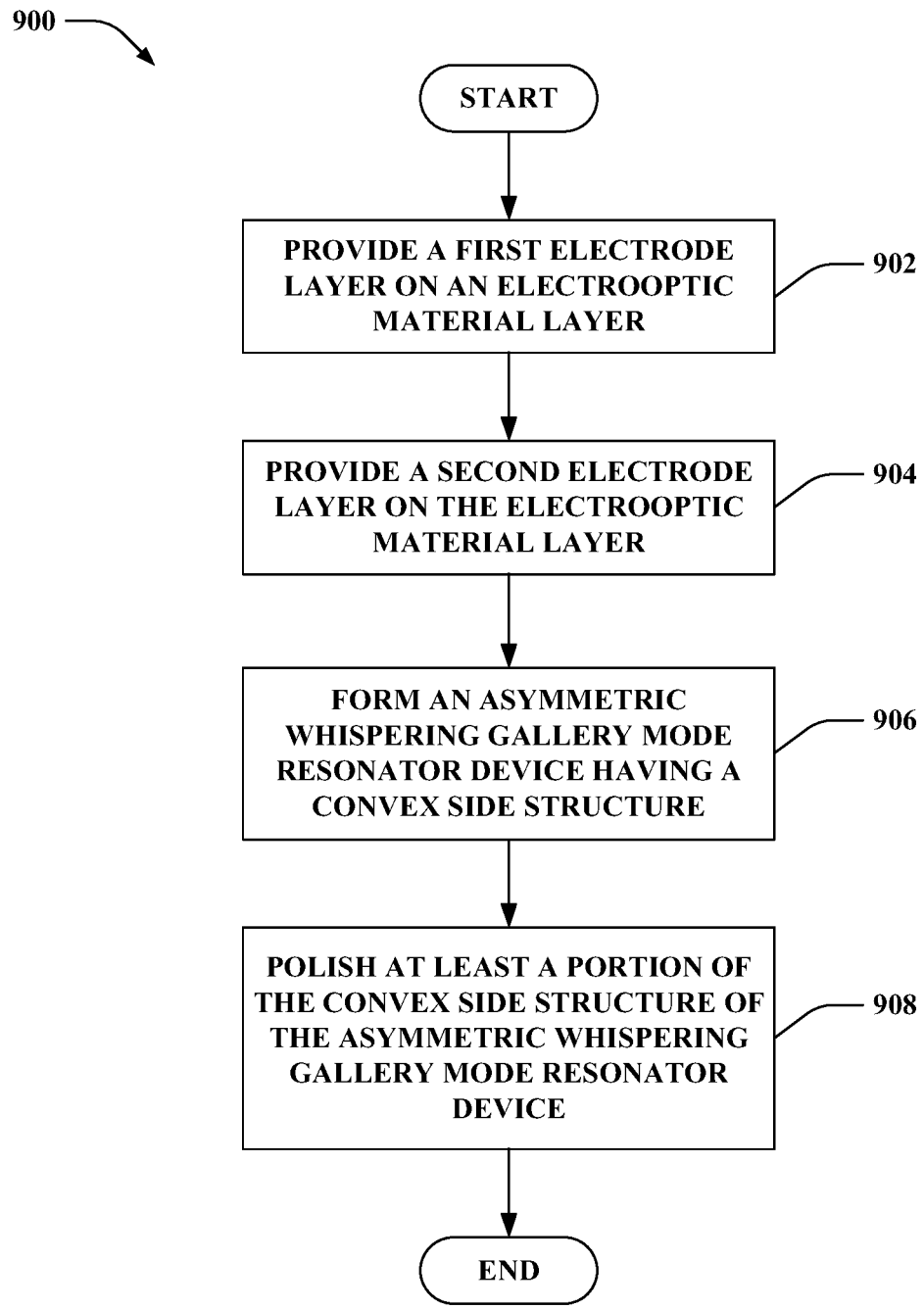
FIG. 9 is a flow diagram that illustrates an exemplary methodology of manufacturing an asymmetric whispering gallery mode resonator device.

FIG. 9 illustrates an exemplary methodology related to manufacturing asymmetric whispering gallery mode resonator devices described herein. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein.

FIG. 9 illustrates a methodology 900 of manufacturing an asymmetric whispering gallery mode resonator device. At 902, a first electrode layer can be provided on an electrooptic material layer. At 904, a second electrode layer can be provided on the electrooptic material layer. The electrooptic material layer can include a crystalline material such as calcium fluoride, magnesium fluoride, lithium niobite, lithium tantalate, silicon, or the like. Moreover, the electrode layers can each include a metal such as gold. Moreover, it is contemplated that optical insulator layers and bonding metal layers can be between each of the electrode layers and the electrooptic material layer.

At 906, the asymmetric whispering gallery mode resonator device having a convex side structure can be formed. The asymmetric whispering gallery mode resonator device can be formed from the first electrode layer, the electrooptic material layer, and the second electrode layer (as well as other layers, if any). A resonator disk can be formed in the electrooptic material layer. The resonator disk can include an axial surface along a perimeter of the resonator disk, where a first midplane passes through the axial surface dividing the axial surface into symmetrical halves. The resonator disk further includes a top surface, a bottom surface substantially parallel to the top surface, a first chamfered edge, and a second chamfered edge. A second midplane is substantially equidistant between the top surface and the bottom surface. Moreover, the asymmetric whispering gallery mode resonator device is formed such that the first midplane and the second midplane are non-coextensive. The first chamfered edge is between the top surface and the axial surface, and the second chamfered edge is between the bottom surface and the axial surface. Further, the axial surface, the first chamfered edge, and the second chamfered edge form the convex side structure. At 908, at least a portion of the convex side structure of the asymmetric whispering gallery mode resonator device can be polished. According to an example, the axial surface can be polished (without polishing the first chamfered edge and the second chamfered edge). Pursuant to another example, the axial surface as well as the chamfered edges can be polished.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A resonator device, comprising:
    an asymmetric whispering gallery mode resonator disk formed of a transparent material, the asymmetric whispering gallery mode resonator disk comprising:
        an axial surface along a perimeter of the whispering gallery mode resonator disk;
        a top surface;
        a bottom surface substantially parallel to the top surface;
        a first chamfered edge between the top surface and the axial surface, the first chamfered edge having a first width between the top surface and the axial surface; and
        a second chamfered edge between the bottom surface and the axial surface, the second chamfered edge having a second width between the bottom surface and the axial surface, wherein the second width of the second chamfered edge differs from the first width of the first chamfered edge;
    a first electrode on the top surface of the asymmetric whispering gallery mode resonator disk; and
    a second electrode on the bottom surface of the asymmetric whispering gallery mode resonator disk.

2. The resonator device of claim 1, wherein the first width of the first chamfered edge is greater than the second width of the second chamfered edge.

3. The resonator device of claim 1, wherein:
    a midplane passes through the axial surface dividing the axial surface into symmetrical halves; and
    the midplane is shifted towards one of the top surface or the bottom surface such that a first distance between the midplane and the top surface differs from a second distance between the midplane and the bottom surface.

4. The resonator device of claim 3, wherein the resonator device supports a fundamental mode located in the midplane.

5. The resonator device of claim 1, wherein a first angle of the first chamfered edge relative to the axial surface is in a range between 20 and 45 degrees, and a second angle of the second chamfered edge relative to the axial surface is in a range between 20 and 45 degrees.

6. The resonator device of claim 5, wherein the first angle of the first chamfered edge relative to the axial surface differs from the second angle of the second chamfered edge relative to the axial surface.

7. The resonator device of claim 5, wherein the first angle of the first chamfered edge relative to the axial surface is substantially similar to the second angle of the second chamfered edge relative to the axial surface.

8. The resonator device of claim 1, wherein the axial surface, the first chamfered edge, and the second chamfered edge are polished.

9. The resonator device of claim 1, wherein the axial surface is polished, and wherein the first chamfered edge and the second chamfered edge are unpolished.

10. The resonator device of claim 1, wherein the transparent material is an electrooptic material, and the asymmetric whispering gallery mode resonator disk is formed of the electrooptic material.

11. The resonator device of claim 1, wherein:
a thickness of the asymmetric whispering gallery mode resonator disk is in a range between 40 and 60 micrometers; and
a diameter of the asymmetric whispering gallery mode resonator disk is in a range between 1.2 and 1.4 millimeters.

12. The resonator device of claim 1, wherein the axial surface, the first chamfered edge, and the second chamfered edge form a convex side structure of the asymmetric whispering gallery mode resonator disk.

13. A lidar sensor system, comprising:
a laser;
an optical coupler that is coupled to the laser; and
an asymmetric whispering gallery mode resonator device that is coupled to the optical coupler, the asymmetric whispering gallery mode resonator device comprising a resonator disk formed of an electrooptic material, the resonator disk comprising:
an axial surface along a perimeter of the resonator disk, the axial surface being polished;
a top surface;
a bottom surface substantially parallel to the top surface;
a first chamfered edge between the top surface and the axial surface, the first chamfered edge being unpolished; and
a second chamfered edge between the bottom surface and the axial surface, the second chamfered edge being unpolished;
wherein the axial surface, the first chamfered edge, and the second chamfered edge form a convex side structure of the asymmetric whispering gallery mode resonator disk.

14. The lidar sensor system of claim 13, the asymmetric whispering gallery mode resonator device further comprising:
a first electrode on the top surface of the resonator disk; and
a second electrode on the bottom surface of the resonator disk.

15. The lidar sensor system of claim 13, wherein a width of the first chamfered edge differs from a width of the second chamfered edge.

16. The lidar sensor system of claim 13, wherein:
a midplane passes through the axial surface dividing the axial surface into symmetrical halves; and
the midplane is shifted towards one of the top surface or the bottom surface such that a first distance between the midplane and the top surface differs from a second distance between the midplane and the bottom surface.

17. The lidar sensor system of claim 13, wherein:
a midplane passes through the axial surface dividing the axial surface into symmetrical halves; and
the midplane and the top surface are tilted relative to each other.

18. The lidar sensor system of claim 13, wherein:
a midplane passes through the axial surface dividing the axial surface into symmetrical halves; and
the asymmetric whispering gallery mode resonator device supports a fundamental mode located in the midplane.

19. The lidar sensor system of claim 13, wherein a first angle of the first chamfered edge relative to the axial surface is in a range between 20 and 45 degrees, and a second angle of the second chamfered edge relative to the axial surface is in a range between 20 and 45 degrees.

20. A method of manufacturing an asymmetric whispering gallery mode resonator device, comprising:
providing a first electrode layer on an electrooptic material layer;
providing a second electrode layer on the electrooptic material layer, wherein the first electrode layer and the second electrode layer are on opposite sides of the electrooptic material layer;
forming the asymmetric whispering gallery mode resonator device having a convex side structure from the first electrode layer, the electrooptic material layer, and the second electrode layer, wherein a resonator disk is formed in the electrooptic material layer, the resonator disk comprising:
an axial surface along a perimeter of the resonator disk;
a top surface;
a bottom surface substantially parallel to the top surface;
a first chamfered edge between the top surface and the axial surface, the first chamfered edge having a first width between the top surface and the axial surface; and
a second chamfered edge between the bottom surface and the axial surface, the second chamfered edge having a second width between the bottom surface and the axial surface, wherein the second width of the second chamfered edge differs from the first width of the first chamfered edge;
wherein the axial surface, the first chamfered edge, and the second chamfered edge form the convex side structure; and
polishing at least a portion of the convex side structure of the asymmetric whispering gallery mode resonator device.

* * * * *